United States Patent [19]

Lipp

[11] Patent Number: 5,367,210
[45] Date of Patent: Nov. 22, 1994

[54] OUTPUT BUFFER WITH REDUCED NOISE

[76] Inventor: Robert J. Lipp, 15881 Rose Ave., Los Gatos, Calif. 95030

[21] Appl. No.: 836,048

[22] Filed: Feb. 12, 1992

[51] Int. Cl.$^5$ .................. H03K 19/092; H03K 17/16
[52] U.S. Cl. ........................................ 326/26; 326/83; 326/122
[58] Field of Search .................. 307/475, 443, 451

[56] References Cited

U.S. PATENT DOCUMENTS

| | | | |
|---|---|---|---|
| 4,634,890 | 1/1987 | Lee | 307/443 |
| 4,791,322 | 12/1988 | Graham et al. | 307/443 |
| 4,818,901 | 4/1989 | Young et al. | 307/443 |
| 4,855,624 | 8/1989 | Kertis et al. | 307/443 |
| 4,912,745 | 3/1990 | Fitzpatrick et al. | 307/443 |
| 5,065,049 | 11/1991 | Jang | 307/443 |

*Primary Examiner*—Edward P. Westin
*Assistant Examiner*—Richard Roseen
*Attorney, Agent, or Firm*—Skjerven, Morrill, MacPherson, Franklin & Friel

[57] ABSTRACT

An output buffer and a method provide controlled low noise operation using a current mirror which provides a rapid increase in the gate voltage of an output transistor prior to the gate voltage reaching the threshold voltage of the output transistor and provide a constant current voltage ramp thereafter. In one embodiment, the present invention automatically compensates for normal variations in transistor channel length due to fluctuations of process parameters. In one embodiment, a mechanism for switching off the current mirror is provided to reduce power consumption.

13 Claims, 4 Drawing Sheets

OUTPUT BUFFER WITH REDUCED NOISE

BACKGROUND OF THE INVENTION

1. Field of the Invention

This invention relates to the field of integrated circuit design. In particular, it relates to output buffer designs in integrated circuits.

2. Description of the Related Art

An output buffer for transmitting a signal from an integrated circuit to an external circuit is typically designed to drive a relatively high load capacitance (e.g. tens of picofarads) in a very short period of time (e.g. a few nanoseconds). Often, such an output buffer switches simultaneously with other output buffers in the integrated circuit, and the currents required to switch these output buffers are supplied through power and ground pins, which are inherently inductive. Because of the inductance in such power and ground pins, the large instantaneous currents required for simultaneous fast operation of these output buffers may not be available. Consequently, when a large number of output buffers switch simultaneously, large noise pulses can be created on the integrated circuit's internal power and ground lines, resulting in spurious operation or failure of the integrated circuit in its operating environment.

In the prior art, reduction in switching induced noise in output buffers is typically achieved by either increasing the number of power and ground pins or by reducing inductance. However, such improvements are approaching their practical limits. An alternative method controls such noise by providing in the output buffers a substantially constant and controlled "turn on" rate ("slew rate"), which is defined as the rate of current increase ("di/dt") in the output buffer. Many examples of this alternative method can be found in the prior art.

An MOS output buffer is typically formed by one or more predriver stages and a driver stage. In most implementations, the predriver and driver stages are each formed by an inverting logic element. Also, in an MOS output buffer, the slew rate is controlled by both the size of each output transistor in the driver stage (the "output transistor") and the rate of change in gate voltage in the output transistor. Thus, for a fixed size output buffer, the slew rate can be controlled by the voltage ramp in the gate terminal of the output transistor. Several basic methods have been employed to control this voltage ramp, including (i) dividing the output transistor into several discrete transistors which are turned on sequentially; (ii) providing a resistive element (e.g. a high impedance transistor) serially connected to the gate terminal of the output transistor to limit the rise time of the gate voltage; (iii) providing a capacitive feedback to slow the rise time of the gate voltage; or (iv) driving the gate voltage of the output transistor by a constant current source derived from a conventional current mirror, so as to achieve a substantially linear voltage ramp.

The constant current source approach is very attractive in sub-micron MOS transistors, since a substantially linear voltage ramp at the gate terminal of a transistor provides a substantially constant slew rate (i.e. current change) over much of the output buffer's operating range of output voltages. Nonetheless, there are several problems with this approach. First, the effectiveness of this method depends on a substantially constant current, which is preferably independent of process variations. However, such a process insensitive current is difficult to achieve. Second, a significant delay exists between the time the input signal to the output buffer starts to switch and the time the output transistor turns on, which occurs only after the gate voltage rises above the threshold voltage of the output transistor. Third, the reference current in the constant current source typically draws power at all times, resulting in a significant level of power consumption for an integrated circuit with many outputs.

Normal process variations can affect the operation of an output buffer significantly. For example, transistor channel length can vary by as much as 25%, which can represent a near doubling of noise in the output buffer. Further, in a conventional output buffer which output transistor is driven by a current mirror circuit with an MOS reference transistor, a 25% decrease in transistor channel length results in the compounding or multiplicative effects of (i) the reference current increasing 25%, (ii) the predriver's load (i.e. the capacitance in the gate of the output transistor) decreasing 25%, and (iii) the gain of the output transistor increasing 25%. Consequently, noise generated by the output buffer is significantly increased.

A number of solutions are proposed in the prior art to overcome the above deficiencies of the constant current source approach. For example, U.S. Pat. No. 4,823,029, entitled "NOISE CONTROLLED OUTPUT BUFFER" to Gabara, uses a resistor to provide a reference current which is unaffected by variation in transistor channel length. However, high quality resistors in MOS integrated circuits are both difficult to manufacture and subject to other process parameter variations. Further, in addition to being well regulated, a reference current should preferably have a process sensitivity opposite to that of transistor gain, so that a change in reference current due to a variation of a process parameter can be automatically compensated by a corresponding reduction of gain in the output transistor to maintain a substantially constant current. Gabara's reference resistor does not provide such process sensitivity.

Other approaches minimize the delay between the switching of the output buffer's input signal and the output transistor's gate voltage reaching its threshold voltage. For example, U.S. Pat. No. 4,947,063, entitled "METHOD AND APPARATUS FOR REDUCING TRANSIENT NOISE IN INTEGRATED CIRCUITS" to O'Shaughnessy et al, describes using capacitance division (see below) to minimize such delay. O'Shaughnessy also provides a fixed capacitor at the output terminal of the predriver stage to provide a controlled voltage ramp which drives the output stage of the output buffer. The controlled voltage ramp reduces switching noise by constraining the discharge of the output load to a substantially linear rate of current change (di/dt). However, practical and adequate capacitors necessary for O'Shaughnessy's method are not readily available in most MOS processes.

Selected approaches in the prior art, including those discussed in Gabara and O'Shaughnessy, are discussed with reference to FIGS. 1 and 2 below.

Figure 1:
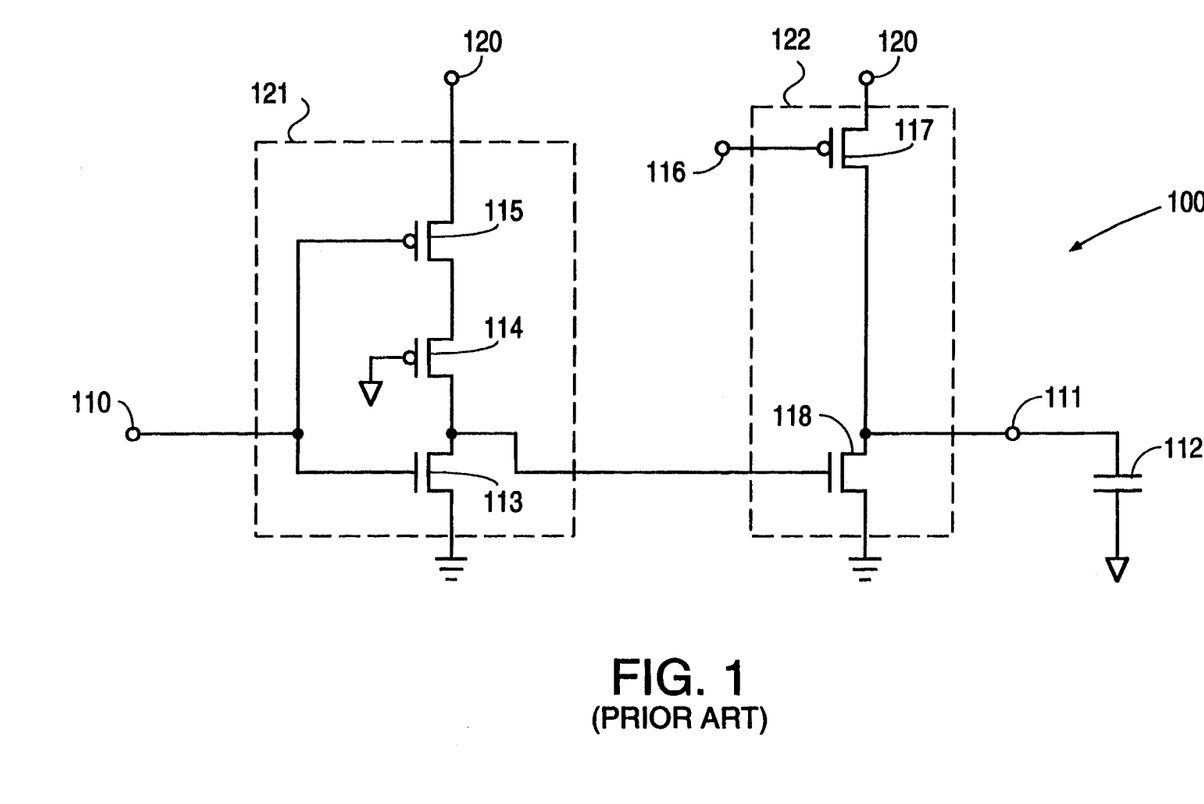
FIG. 1 is a schematic diagram of a prior art output buffer 100.

FIG. 1 shows a prior art slew rate controlled output buffer 100. Pins 10 and 11 are respectively the input and output terminals of output buffer 100. Capacitor 12 represents the load typically driven by output buffer 100. A predriver stage 50, which is a CMOS inverter controlling the pull-down transistor 18 of the driver stage 51, is formed by transistors 13, 14 and 15. Transistors 17 and 18 form the output stage 51 of output buffer 100.

As shown in FIG. 1, when node 38 is pulled to logic high voltage by a transition in predriver stage 50, the gate voltage of transistor 18 is regulated, or slowed, by transistor 14's relatively high impedance (with respect to the impedance of transistor 15). Thus, transistor 14 slows the slew rate of transistor 18, and thereby reduces the rate of current change (i.e. di/dt) in transistor 18. Consequently, the noise generated when the signal at output terminal 11 switches from logic high voltage to logic low voltage is also reduced.

In FIG. 1, a complementary predriver circuit 52 (not shown) drives node 16, which is the gate terminal of the pull-up transistor 17, to control the low-to-high transition of the signal at output terminal 11. In complementary predriver 52, a relatively high impedance transistor similar to transistor 14, regulates the current flowing from node 16 to ground.

Circuit 100 is satisfactory in reducing the rate of current change in the output stage 51. However, several drawbacks are associated with this approach. First, the gate voltages for output transistors 17 and 18 do not increase linearly, but each gate voltage exhibits an exponential rise characteristic similar to that of an RC circuit. Thus, for a fixed noise level, output buffer 100 will respond more slowly than if linear gate voltage ramps were provided at nodes 16 and 38. Second, the performance of output buffer 100 can vary widely with process variation, so as to be undesirably slow when the process and operating conditions are under most unfavorable ("worst case") conditions, and excessively noisy under the most favorable ("best case") conditions. Third, even though initially aided by the capacitance division effect existing between node 7 (i.e. the source terminal of transistor 15) and node 38, a significant delay still exists between the time the gate voltage of output transistor 18 increases from zero volts to the time the gate voltage reaches threshold voltage. (The capacitance division effect is provided by the parasitic capacitors in the nodes 7 and 38. Immediately after transistor 15 is turned on, the charge stored in node 7 is divided between nodes 7 and 38, thereby increasing the rate at which node 38 is brought to the threshold voltage of output transistor 18).

Because of the above drawbacks, output buffer 100 is not satisfactory when both very fast response time and good noise control are required.

Figure 2:
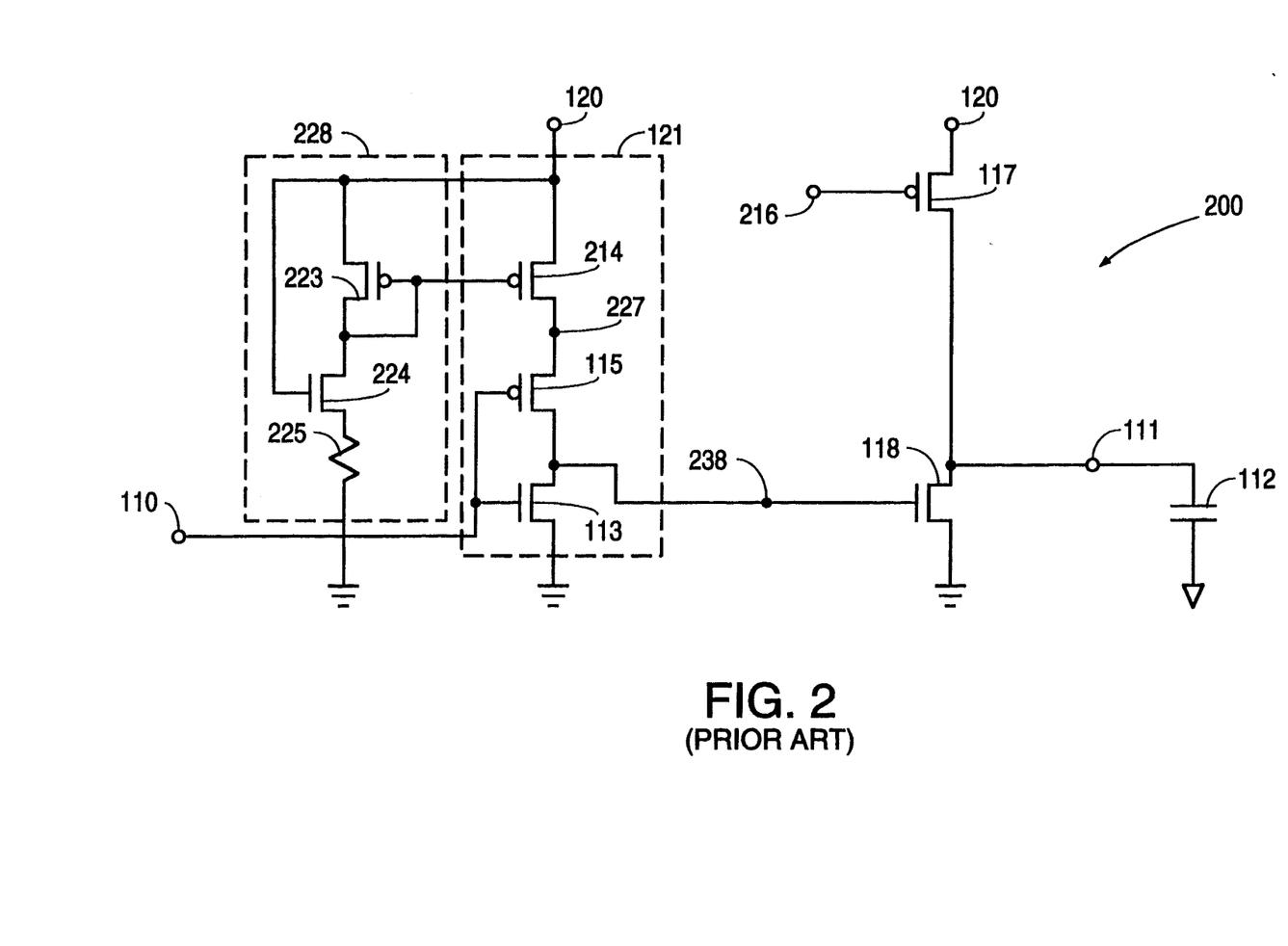
FIG. 2 is a schematic circuit of an output buffer 200 having an output impedance controlled by the current mirror control circuit 28.

FIG. 2 is a schematic diagram of a prior art output buffer driver 200. To facilitate reference, components in FIGS. 1 and 2 which perform substantially the same functions are given identical reference numerals. Output buffer 200 incorporates a current mirror control circuit 28 into the pull-up of predriver stage 60, which is formed by current mirror control or reference circuit 28, and transistors 20, 21 and 22. Transistor 22, which is the output transistor of a conventional current mirror controlled by the current mirror control circuit 28, provides a substantially constant current output. Current mirror control circuit 28 comprises transistors 23 and 24. The output signal of predriver stage 60 drives node 38, which is the gate terminal of the pulldown transistor 18 of output stage 61. As in FIG. 1, output stage 61 of output buffer driver 200 comprises output transistors 17 and 18 driving an output load 12, which is connected to output pad 11. A complementary predriver circuit 62 (not shown), similar to predriver stage 60, is used to drive node 16 to provide the pull-up control of driver stage 61.

By incorporating current source control circuit 28 into predriver 60, the substantially constant current of transistor 22 provides a substantially linear gate voltage ramp at node 38, which is the gate terminal of output transistor 18. Thus, as compared to circuit 100 of FIG. 1, output buffer 200 can be designed to achieve either a reduced level of noise for the same performance as circuit 100, or increased performance over circuit 100 without exceeding the same noise level. A further advantage can be achieved by replacing transistor 24 in current mirror control circuit 28 by a resistor, which provides a relatively more stable current over a wider range of operating conditions than using a transistor (e.g. transistor 24) as a current reference. However, a resistor responds to process variations substantially differently than a reference transistor. Consequently, a resistor in place of transistor 24 exhibits a wide range of characteristics that is not tracked by transistors in the circuit.

The capacitance division effect discussed in FIG. 1 above can also be seen in FIG. 2. In FIG. 2, when the input signal of pin 10 switches from logic high voltage to logic low voltage, the charge stored in the parasitic capacitor of node 27 is divided between the parasitic capacitors of nodes 27 and 38. The current associated with this charge sharing increases the rate at which the gate voltage of output transistor 18 is brought to threshold voltage. A further improvement taught by O'Shaughnessy referenced above uses an additional coupling capacitor to speed up signal 38. However, while capacitance division or O'Shaughnessy's method, or both, may be satisfactorily used in some applications, the large coupling capacitors required for complete effectiveness may be impractical, especially if output transistor 18 has a large gate capacitance.

There are many examples in the prior art which use a current regulating transistor with an impedance controllable by a control circuit, such as the current mirror of FIG. 2 discussed above, which comprises current regulating transistor 22 and current mirror control circuit 28. In FIG. 2, pull-up transistor 22 of predriver stage 60 is coupled to a power supply pin VDD. (Similarly, the corresponding current regulating transistor in predriver stage 62 (not shown) is coupled to a ground pin). All such examples in the prior art invariably have such regulating transistors coupled directly to power or ground pins. By coupling current regulating transistor 22 to the power supply pin, a convenient common voltage reference to both transistor 22 and current mirror control circuit 28 is provided. Such common reference provides the advantages of easily predictable biasing, operation, and coupling of the control circuit and the current regulating transition. Furthermore, this connection scheme inherently permit some circuit speed up by capacitance division as discussed above.

However, neither circuits in FIGS. 1 and 2 satisfactorily minimize the output transistor's turn on time, which is the time it takes to increase the voltage at the gate of transistor 18 from ground voltage to its threshold voltage. This is because, for a large output transistor, such as transistor 18, the capacitance division effect provides insufficient impact on the speed at which the gate voltage of the output transistor reaches threshold voltage.

Further, because the current mirror control circuit requires a reference current flowing constantly, the output buffers of the prior art consumes power constantly. Neither Gabara nor O'Shaughnessy discloses or suggests any means to fully turn off the reference current when not needed.

SUMMARY OF THE INVENTION

In accordance with the present invention, a method and an apparatus provide a low noise output buffer having predriver and driver stages. The present invention's predriver stage rapidly raises the gate voltage of an output transistor in the driver stage prior to the gate voltage achieving the threshold voltage of the output transistor. Thereafter, the apparatus further raises the gate terminal of the output transistor using a substantially linear voltage ramp.

In one embodiment, an output buffer predriver turns on the buffer output transistor by a current mirror which provides a large current prior to the gate voltage of the output transistor reaching the output transistor's threshold voltage. Thereafter, the current mirror provides a substantially constant current to further raise the gate voltage of the output transistor by a substantially linear voltage ramp. In that embodiment, the buffer predriver also reduces power consumption by eliminating the current drain from the current mirror after the output switches to a low voltage.

In one embodiment, by selecting different channel lengths for the transistors of the current mirror, the present invention minimizes the current mirror's sensitivity to process variations that would otherwise cause undesirably large variations in buffer operation.

In one embodiment, the output buffer pre-driver comprises a logic inverter means, a current mirror means, a current reference means for the current mirror means and a means for turning off said current mirror means.

The predriver stage in accordance with the present invention turns on the output transistor of the output stage faster than a linear voltage ramp of the prior art, since the gate terminal of the output transistor is charged to threshold voltage faster than if such linear voltage ramp is used.

The output buffer in accordance with the present invention provides low noise operation because of the controlled voltage ramp at the gate of output transistor.

DETAILED DESCRIPTION OF THE PREFERRED EMBODIMENTS

Figure 3:
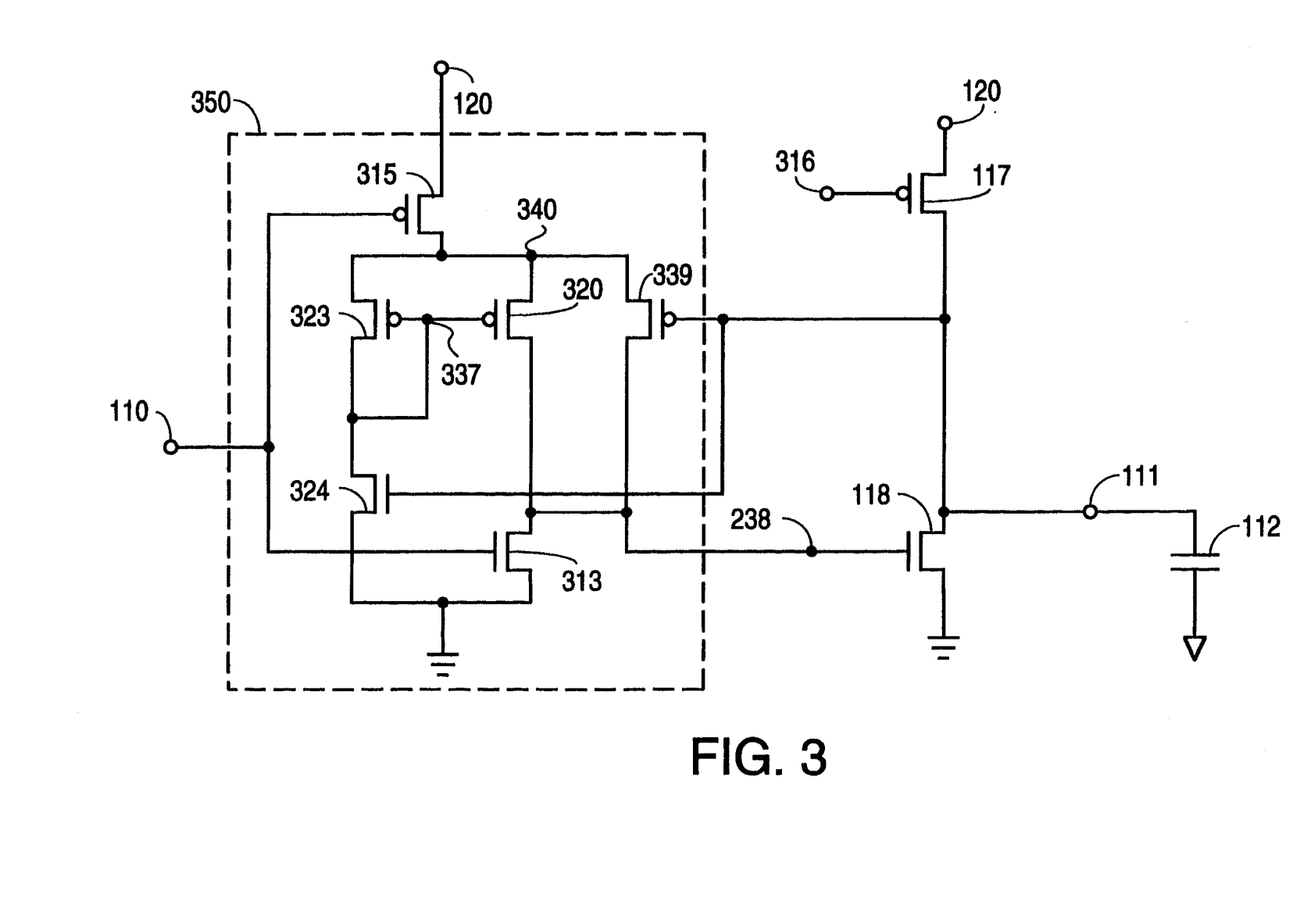
FIG. 3 shows a circuit schematic of an output buffer 300, in accordance with the invention.

FIG. 3 is a circuit schematic diagram of output buffer circuit 300, in accordance with the present invention. In FIG. 3, a predriver stage 70 drives an output stage 71, which comprises transistors 17 and 18. Transistors 32 and 35 together perform the inverting logic function of predriver stage 70. Of course, one of ordinary skill will appreciate that the inverting logic function performed by transistors 32 and 35 can be accomplished by any other inverting logic gate, such as a NAND gate or a NOR gate. Transistors 33, 34 and 36 form a current mirror which mirrors the current through reference transistor 36 to transistor 34, so as to drive node 38 at the gate terminal of output transistor 18. Predriver 31, which drives pull-up transistor 17 of output stage 71, is a complementary predriver stage similar to predriver stage 70. One of ordinary skill will appreciate that the predriver 31 can be obtained from predriver stage 70 by substituting N- and P-transistors for the P- and N-transistors of predriver stage 70.

Transistor 33 is designed to be smaller than transistor 34, so as to create in the current mirror a current gain of approximately 5 (i.e. the mirrored current driving node 38 is 5 times the reference current through transistor 36). Transistors 34 and 36 are devices each having a longer channel length than the other transistors in the output buffer, so as to minimize the effect of channel length variation on the reference current. The transistor ratios of the current mirror are chosen to achieve at node 38 a predetermined voltage ramp. The capacitance at node 38 includes both the gate capacitance of transistor 18 and the parasitic capacitance of node 38. Further, the sizes of transistors 33 and 36 are chosen such that, when the reference current is flowing in transistor 36, node 37 attains the highest possible voltage ("quiescent operating voltage") without making transistor 34 impractically large. Such quiescent operating voltage is preferably higher than midway between the power supply and ground voltages, so as to ensure that the voltage ramp at node 38 is linear for most of its voltage transition range. Transistor 32 is selected to be large enough to pull node 40 close to the power supply voltage quickly, even though sourcing both the currents in transistors 36 and 34. The predriver circuit 70 may be considered impractically large if it occupies an area of the integrated circuit larger than the output transistor it is driving. An example of suitable transistor sizes (W/L ratios) for a 0.8 micron process are tabulated in Table 1 below.

TABLE 1

| Transistor Number | Transistor Size (W/L in microns) |
| --- | --- |
| 18 | 600/0.8 |
| 32 | 100/0.8 |
| 33 | 8.0/0.8 |
| 34 | 200/4.0 |
| 35 | 20/0.8 |
| 36 | 10/4.0 |
| 39 | 10/0.8 |

To understand the operation of buffer circuit 300, assume initially that the voltages at input and output nodes 10 and 11 are both at logic high voltage. Thus, initially transistor 32 is in the "off" or high impedance state, and no current flows through the pre-driver stage 70. At the same time, transistors 35 and 36 are each "on," i.e. in a low impedance state, because of the logic high voltages applied at their respective gate terminals. Hence, both nodes 38 and 37 are discharged to ground. Further, because of the logic high voltage at node 11, transistor 39 is in a high impedance state.

When the input signal on node 10 switches from logic high voltage to logic low voltage, transistor 32 is turned on and transistor 35 is correspondingly turned off. Because transistor 32 is relatively large, as discussed above, node 40 is quickly pulled to a voltage slightly less than the power supply voltage. In the meantime, even though the quiescent operating voltage at node 37 is designed to be higher than midway between the power supply voltage and ground, the voltage at node 37 cannot be brought from ground to the quiescent operating voltage instantaneously. In fact, since transistor 34 is larger than transistor 33, the gate capacitance of transistor 34 controls the rise time of node 37. Further, in the present embodiment, by carefully selecting the relative sizes of transistors 33, 34, 36 and 18, such as those provided in Table 1 above, the time required to bring node 37 to the quiescent voltage is matched to the time required for the mirrored current in transistor 34 to bring node 38 from ground voltage to the threshold voltage of transistor 18.

Prior to node 37 attaining the quiescent operating voltage, the lower voltage at the gate terminal of transistor 34 allows a lower impedance in transistor 34, and thus a larger current through transistor 34 to charge node 38. Consequently, this larger current brings the gate voltage of output transistor 18 to the threshold voltage several times faster than if node 38 was charged by a comparable size constant current source, such as the constant current source formed by circuit 28 and transistor 22 described in conjunction with FIG. 2 above.

The operation of buffer circuit 300 when the voltages on the nodes 10 and 11 are both initially at logic low is similar. In that situation, a low-to-high transition of the input signal at node 10 causes predriver 31 to bring node 11 to logic high voltage in a manner similar to the description provided above for predriver 70.

Figure 4:
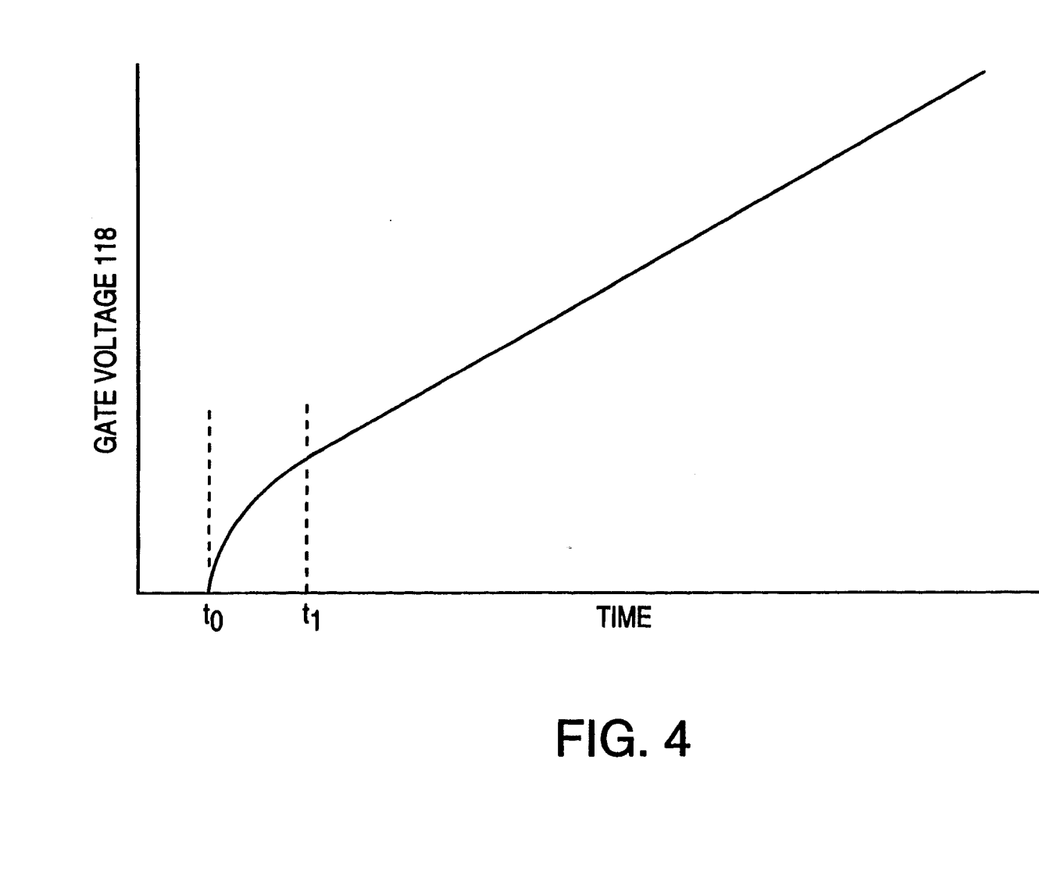
FIG. 4 is a gate voltage versus time graph of the output transistor 18 of FIG. 3.

FIG. 4 shows the voltage at node 38 (i.e. the gate terminal of transistor 18) versus time under the present invention. In FIG. 4, time t0 represents the time when transistor 34 begins to source current to node 38 after the high-to-low transition at the input signal of node 10. Time t1 represents the time when the voltage at node 37 reaches its quiescent operating voltage. As discussed above, time t1 is designed to be approximately the time node 38 reaches transistor 18's threshold voltage. Thus, since the quiescent operating voltage is attained at node 37 after time t1, a constant current flows through transistor 34 to provide a constant rate of voltage increase ("quiescent voltage ramp") at node 38, as shown in FIG. 4. However, because the current in transistor 34 is higher prior to node 37 attaining the quiescent operating voltage, the slope of voltage increase at node 38 between times t0 and t1 is much higher than the slope of quiescent voltage ramp. Thus, the time required to bring node 38 to transistor 18's threshold voltage is significantly shortened. Further, because the present invention does not require a substantial parasitic capacitance, such as required in the prior art capacitance division method discussed above in conjunction with FIG. 2 or capacitance coupling as taught by O'Shaughnessy, the present invention is an improvement over such prior art methods.

As transistor 18 transitions to a low impedance state due to the rising voltage at its gate terminal, the voltage at output node 11 drops, thereby causing transistor 36 to transition to a high impedance state. As transistor 36 turns off, the reference current in transistor 36 diminishes until it is substantially eliminated when node 11 attains the logic low voltage. Consequently, the current mirror in output buffer 300 does not consume power after the output voltage of the output buffer stabilizes. In most applications, the voltage fall time of node 11 is much slower than the voltage rise time at node 38.

Transistor 39 is provided both to sustain the voltage on node 38, and to pull node 38 to the power supply voltage after transistor 36 is turned off by the falling voltage at node 11. Prior to transistor 36's turning off, because of the reference current in transistor 36, node 40 does not reach the power supply voltage VDD. However, after transistor 36 is turned off, transistor 39 and 32 will respectively pull nodes 38 and 40 to the power supply voltage.

Since output node 11 is used to turn off the reference current in the current mirror, the present invention is both power and area efficient. By eliminating a constantly flowing reference current in the current mirror, output buffer 300 is power efficient. Since no additional structure, other than the connection between node 11 and the gate terminal of transistor 36, is required to turn off the reference current of the current mirror, output buffer 300 is also area efficient.

Output buffer 300 can also be used in a tri-state buffer application. In a tri-state buffer application, it is possible that the voltage on node 11 is initially at logic low voltage, even though the signal on node 10 is initially at logic high voltage. In that situation, reference transistor 36 is not turned on. Instead, after a high-to-low transition of the signal on node 10, transistor 39, which is in the low impedance state due to the low voltage on node 11, pulls node 38 to the power supply voltage to ensure that output node 11 stays at logic low voltage.

In a tri-state application, node 11 can also be initially at some intermediate voltage between the power supply voltage and ground. Under this situation, the combined actions of the current mirror and transistor 39 will still pull node 38 to the power supply voltage after a high-to-low transition at the input signal at node 10. Since node 11 is not initially at the full power supply voltage, transistor 36 has a higher impedance, thereby requiring less time for node 37 to reach the quiescent voltage. However, since this quiescent voltage is also higher, transistor 34 sources less current. Consequently, node 38 does not reach threshold voltage as quickly. However, the resulting slew rate is acceptable because the amount of time needed to discharge the capacitive load 12 is shorter because of the intermediate voltage at node 11. Note that transistor 39 is used only to complete a transition or maintain a voltage on node 38. It is not used in speed-critical switching. Since transistor 39 does not regulate current as well as transistor 34, transistor 39 is not designed to have a greater transconductance (i.e. supply more current) than transistor 34, so as to avoid transistor 39 creating a higher level of noise than transistor 34 when operating.

In the prior art, as previously noted, a variation in transistor channel length in a normal manufacturing process can cause a significant variation in output buffer operation. However, output buffer 300 of the present invention automatically compensates for channel length variation. This automatic compensation results from choosing longer channel lengths for transistors 34 and 36. For example, for a given process, if the standard transistor channel length is 0.8 microns, transistors 34 and 36 are made 4.0 microns long. Thus, if the process variation in channel length is ±0.2 microns, causing a ±0.2/0.8 or ±25% current gain in the standard transistor (0.8 micron channel length), the corresponding variation in transistor current gain for transistors 34 and 36 (each having a 4.0 micron channel length) will only be ±0.2/4.0 or ±5%. In other words, if the channel length variation is +0.2, the current in reference transistor 36 decreases only by 5%. At the same time, the current in transistor 34 is affected by both the variation in current gain of transistor 36 and the current mirror's variation in current gain, which is substantially equal to the ratio of the relative changes in the channel lengths of transistors 33 and 34. In this example, the current mirror's current gain will increase by $(0.8+0.2)/0.8*4.0/(4.0+0.2)=19\%$. Consequently, the net current in transistor 34 is $1.19*0.95=1.13$, representing a net current gain of 13% over the nominal current in transistor 34. Thus, the present invention automatically compensates the current mirror for a change in transistor channel length. Furthermore, the net current gain of 13% in transistor 34 substantially compensates for the decrease in output transistor 18's current gain due to the same channel length variation.

The above detailed description is provided to illustrate the specific embodiments of the invention, and is not intended to be limiting. Numerous modifications and variations are possible within the scope of the present invention, which is set forth in the following claims.

I claim

1. An output buffer comprising:
  a driver stage including an output transistor having a gate terminal for receiving a voltage, said output transistor having low impedance and high impedance states determined by whether said voltage is higher or lower than a threshold voltage, said driver stage providing a feedback signal to indicate whether said voltage is higher or lower than said threshold voltage; and
  means for controlling said driver stage, receiving said feedback signal, said means for controlling causing said output transistor to transition from said high impedance state to said low impedance state by providing at said gate terminal of said output transistor, prior to said voltage reaching said threshold voltage, as indicated by said feedback signal, a varying rate of voltage increase, and providing, after said threshold voltage is reached, as indicated by said feedback signal, a substantially constant rate of voltage increase less than said varying rate of voltage increase.

2. An output buffer as in claim 1, wherein said means for controlling comprises:
  means for rapidly bringing an electrical node to a reference voltage;
  means, coupled to said electrical node and said gate terminal, for providing a varying current prior to said electrical node is brought to said reference voltage and for providing a substantially constant current after said electrical node is brought to said reference voltage, said varying current and said substantially constant current causing said varying rate of voltage increase and said substantially constant rate of voltage increase at said gate terminal.

3. An output buffer comprising:
  a driver stage including an output transistor having a gate terminal for receiving a voltage, said output transistor having low impedance and high impedance states determined by whether said voltage is higher or lower than a threshold voltage, said driver state providing a feedback signal to indicate whether said voltage is higher or lower than said threshold voltage; and
  means for controlling said driver stage, receiving said feedback signal, said means for controlling causing said output transistor to transition from said high impedance state by providing at said gate terminal of said output transistor, prior to said voltage reaching said threshold voltage, as indicated by said feedback signal, a varying rate of voltage increase, and providing, after said threshold voltage is reached, as indicated by said feedback signal, a substantially constant rate of voltage increase less than said varying rate of voltage increase,
  wherein said means for controlling comprises:
    means for rapidly bringing an electrical node to a reference voltage,
    means, coupled to said electrical node and said gate terminal, for providing a varying current prior to said electrical node is brought to said reference voltage and for providing a substantially constant current after said electrical node is brought to said reference voltage, said varying current and said substantially constant current causing said varying and substantially constant voltage at said gate terminal,
    wherein said means for providing a varying current comprises a current mirror, and
    wherein said means for rapidly bringing an electrical node to a reference voltage comprises a transistor connected between a reference voltage source and said current mirror.

4. An output buffer as in claim 3, further comprising means for disabling said means for providing a varying current in response to said output transistor reaching said low impedance state.

5. A method for providing a low noise output buffer, comprising the steps of:
  receiving a voltage on a gate terminal of an output transistor, said output transistor being part of a driver stage of said low noise output buffer, said output transistor having low impedance and high impedance states determined by whether said voltage is higher or lower than a threshold voltage,
  providing a feedback signal indicating whether said voltage is higher or lower than said threshold voltage; and
  controlling said driver stage to cause said output transistor to transition from said low impedance state to said high impedance state by increasing said voltage at a varying rate until said voltage reaches said threshold voltage, as indicated by said feedback signal, then increasing said voltage at a substantially constant rate.

6. A method as in claim 5, wherein said step of controlling comprises:
  rapidly bringing an electrical node to a reference voltage;
  supplying a varying current at said electrical node until said reference voltage is reached, said varying current bringing charge to said gate terminal thereby increasing said voltage at said varying rate; and
  supplying a substantially constant current at said electrical node after said reference voltage is reached, said varying current bringing charge to said gate terminal thereby increasing said voltage at said substantially constant rate.

7. A method for providing a low noise output buffer, comprising the steps of:
  receiving a voltage on a gate terminal of an output transistor, said output transistor being part of a driver stage of said low noise output buffer, said output transistor having a low impedance and high impedance states determined by whether said voltage is higher or lower than a threshold voltage;

providing a feedback signal indicating whether said voltage is higher or lower than said threshold voltage; and controlling said driver stage to cause said output transistor to transition from said low impedance state to said high impedance state by increasing said voltage at a varying rate until said voltage reaches said threshold voltage, as indicated by said feedback signal, then increasing said voltage at a substantially constant rate, wherein said step of controlling further comprises the steps of:

rapidly bringing an electrical node to a reference voltage; and supplying a varying current at said electrical node until said reference voltage is reached, then supplying a substantially constant current at said electrical node, said varying current and said substantially constant current bringing charge to said gate terminal to cause said varying and substantially constant increases in said voltage at said gate terminal, wherein said step of supplying a varying current comprises the step of using a current mirror to supply said varying current and said substantially constant current and wherein said step of rapidly bringing an electrical node to a reference voltage comprises switching on a transistor coupled between a reference voltage source and said current mirror.

8. A method as in claim 6 further comprising the step of disabling said substantially constant current in response to said output transistor reaching said low impedance state.

9. A current mirror comprising:
a first MOS transistor having gate, source and drain terminals, said source terminal coupled to a first reference voltage source said gate terminal coupled to said drain terminal;
a second MOS transistor coupled between said drain terminal of said first MOS transistor and a second reference terminal; and
a third MOS transistor having gate, source and drain terminals, said gate terminal of said third MOS transistor coupled to said gate terminal of said first MOS transistor, said source terminal of said third MOS transistor coupled to said first reference voltage source and said drain terminal of said third MOS transistor coupled to a current receiving load;

wherein said second and third MOS transistors each have a channel length longer than the channel length of said first MOS transistor, such that a variation in channel length in the course of manufacturing said first, second and third MOS transistors reducing the current flowing in said second transistor causes a corresponding gain in said current mirror to provide a net gain in a current flowing between said source and drain terminals of said second MOS transistor.

10. An output buffer as in claim 3, wherein said current mirror comprises:
a first MOS transistor having gate, source and drain terminals, said source terminal coupled to said reference voltage source said gate terminal coupled to said drain terminal;
a second MOS transistor coupled between said drain terminal of said first MOS transistor and a second reference terminal; and a third MOS transistor having gate, source and drain terminals, said gate terminal of said third MOS transistor coupled to said gate terminal of said first MOS transistor, said source terminal of said third MOS transistor coupled to said reference voltage source and said drain terminal of third MOS transistor coupled to said gate terminal of said output transistor;

wherein said second and third MOS transistors each have a channel length longer than the channel length of said first MOS transistor, such that a variation in channel length in the course of manufacturing said first, second and third MOS transistors reducing the current flowing in said second transistor causes a corresponding gain in said current mirror to provide a net gain in a current flowing between said source and drain terminals of said second MOS transistor.

11. A method for providing a low noise output buffer, comprising the steps of:
receiving a voltage on a gate terminal of an output transistor, said output transistor being part of a driver stage of said low noise output buffer, said output transistor having low impedance and high impedance states determined by whether said voltage is higher or lower than a threshold voltage;

providing a feedback signal indicating whether said voltage is higher or lower than said threshold voltage; and controlling said driver stage to cause said output transistor to transition from said low impedance state to said high impedance state by increasing said voltage at a varying rate until said voltage reaches said threshold voltage, as indicated by said feedback signal, then increasing said voltage at a substantially constant rate, wherein said step of controlling further comprises the steps of:

rapidly bringing an electrical node to a reference voltage; and supplying a varying current at said electrical node until said reference voltage is reached, then supplying a substantially constant current at said electrical node, said varying current and said substantially constant current bringing charge to said gate terminal to cause said varying and substantially constant increases in said voltage at said gate terminal, wherein said step of supplying a varying current and substantially constant current comprises the steps of:

coupling a first MOS transistor having gate, source and drain terminals to a first reference source, said source terminal of said first MOS transistor coupled to said first reference voltage sources;

coupling a second MOS transistor between said drain terminal of said first MOS transistor and a second reference terminal; and coupling a third MOS transistor having gate, source and drain terminals to said first MOS transistor, said first reference voltage source, and a current receiving node, said gate terminal of said third MOS transistor coupled to said gate terminal of said first MOS transistor, said source terminal of said third MOS transistor coupled to said first reference voltage source, and said drain terminal of said third MOS transistor coupled to said current receiving node;

wherein each of said second and third MOS transistors has a channel length longer than the channel length of said first MOS transistor, such that a variation of channel length in the course of manufacturing said first, second and third MOS transistors reducing the current flowing in said second transistor causes a corresponding gain in said current mirror to provide a net gain in a current flowing between said source and drain terminals of said second MOS transistor.

12. An output buffer having an input and output terminal, comprising:

a driver stage receiving a first signal at a first terminal and providing a second signal complementary to said first signal on said output terminal; and a predriver stage coupled to said input terminal, comprising:

a first MOS transistor having a gate terminal coupled to said input terminal, a source terminal coupled to a first reference voltage source, and a drain terminal;

a second MOS transistor having a source terminal coupled to said drain terminal of said first MOS transistor, a drain terminal coupled to said first terminal of said driver stage, and a gate terminal;

a current mirror control circuit coupled to the gate terminal of said second MOS transistor for regulating a current flowing between said source and drain terminals of said second MOS transistor; and a third MOS transistor having a drain terminal coupled to said first terminal of said driver stage, a gate terminal coupled to said input terminal and a source terminal coupled to a second reference voltage source;

wherein said current mirror is enabled and disabled by said second signal.

13. An output buffer as in claim 12, wherein said predriver stage further comprises a fourth MOS transistor having a gate terminal coupled to said second signal, a source terminal coupled to said drain terminal of said first MOS transistor, and a drain terminal coupled to said first terminal of said driver stage.

* * * * *